United States Patent
Ji et al.

(10) Patent No.: US 9,980,417 B1
(45) Date of Patent: May 22, 2018

(54) MAGNETIC ELECTROMAGNETIC INTERFERENCE GASKET

(71) Applicant: Cisco Technology, Inc., San Jose, CA (US)

(72) Inventors: Feng Ji, Shanghai (CN); Jianquan Lou, Shanghai (CN); Chen Peng, Shanghai (CN); Alpesh U. Bhobe, Sunnyvale, CA (US); Yingchun Shu, Shanghai (CN); Jinghan Yu, Shanghai (CN); Li Xiaogang, Shanghai (CN)

(73) Assignee: Cisco Technology, Inc., San Jose, CA (US)

( * ) Notice: Subject to any disclaimer, the term of this patent is extended or adjusted under 35 U.S.C. 154(b) by 0 days. days.

(21) Appl. No.: 15/402,405

(22) Filed: Jan. 10, 2017

(51) Int. Cl.
*H05K 9/00* (2006.01)

(52) U.S. Cl.
CPC ................. *H05K 9/0015* (2013.01)

(58) Field of Classification Search
CPC .................................................. H05K 9/0015
USPC .................................................. 361/816, 818
See application file for complete search history.

(56) References Cited

U.S. PATENT DOCUMENTS

| | | | | |
|---|---|---|---|---|
| 3,889,043 A * | 6/1975 | Jean Ducros | ........ | H05K 9/0015 174/353 |
| 3,969,572 A * | 7/1976 | Rostek | ................ | H05K 9/0015 174/353 |
| 4,820,885 A * | 4/1989 | Lindsay | ............... | H05K 9/0015 174/353 |
| 4,857,668 A * | 8/1989 | Buonanno | ............ | H05K 9/0015 174/354 |
| 5,160,806 A * | 11/1992 | Harada | ................... | H05B 6/763 174/353 |
| 6,525,267 B1 * | 2/2003 | Worley | .................. | F16J 15/024 174/370 |
| 6,720,494 B1 * | 4/2004 | Norte | .................... | H05K 9/0015 174/388 |
| 7,456,365 B2 * | 11/2008 | Gilliland | ................ | F16J 15/064 174/356 |
| 7,511,970 B2 | 3/2009 | Justason et al. | | |
| 8,674,237 B1 * | 3/2014 | Gilliland | .............. | H05K 9/0015 174/354 |
| 2012/0228020 A1 | 9/2012 | Winch et al. | | |
| 2016/0174715 A1 | 6/2016 | Nelson et al. | | |

OTHER PUBLICATIONS

EMI Catalog, EMI-CAT-Essentials 1213, http://pdf.directindustry.com/pdf/laird-technologies/emi-catalog/12624-453799.html, accessed Jan. 9, 2017, pp. 1-60.
EMI Catalog, EMI-CAT-Essentials 1213, http://pdf.directindustry.com/pdf/laird-technologies/emi-catalog/12624-453799.html, accessed Jan. 9, 2017, pp. 61-117.
3M™ Copper Foil Tape 1181, Copper Foil with Conductive Adhesive, Data Sheet, Apr. 2010, www.3M.com, 78-8127-9953-0 A, 2 pages.
Fabric Over Foam, Profile Selection Guide, www.schlegelemi.com, Feb. 2016, 22 pages.

* cited by examiner

*Primary Examiner* — Hung S Bui
(74) *Attorney, Agent, or Firm* — Edell, Shapiro & Finnan, LLC

(57) ABSTRACT

An electromagnetic interference (EMI) gasket is provided that includes a resiliently-flexible and conductive outer shell, a cushioning element disposed in the outer shell, and at least one magnetic component disposed in the outer shell configured to magnetically couple to a conductive surface of an electronic device chassis.

20 Claims, 6 Drawing Sheets

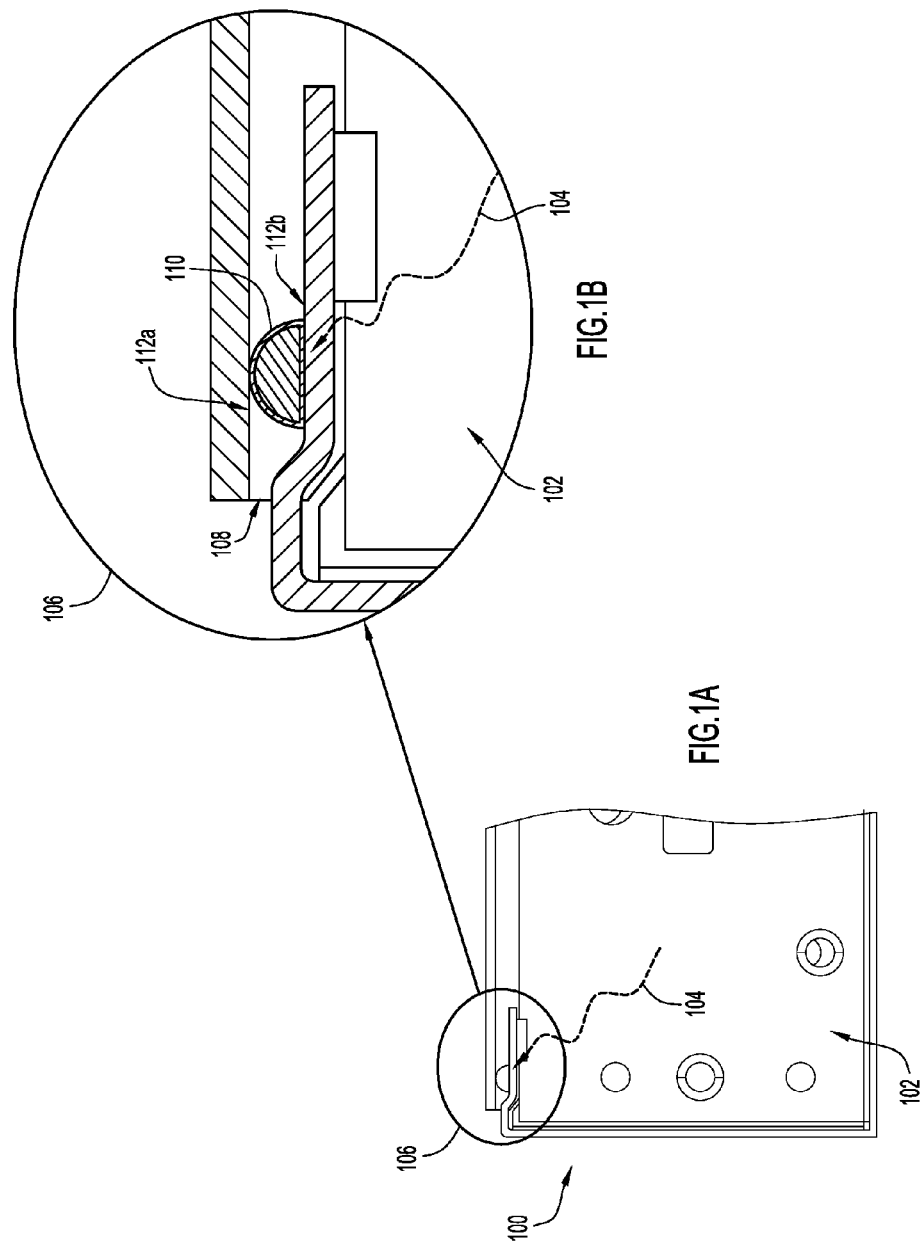

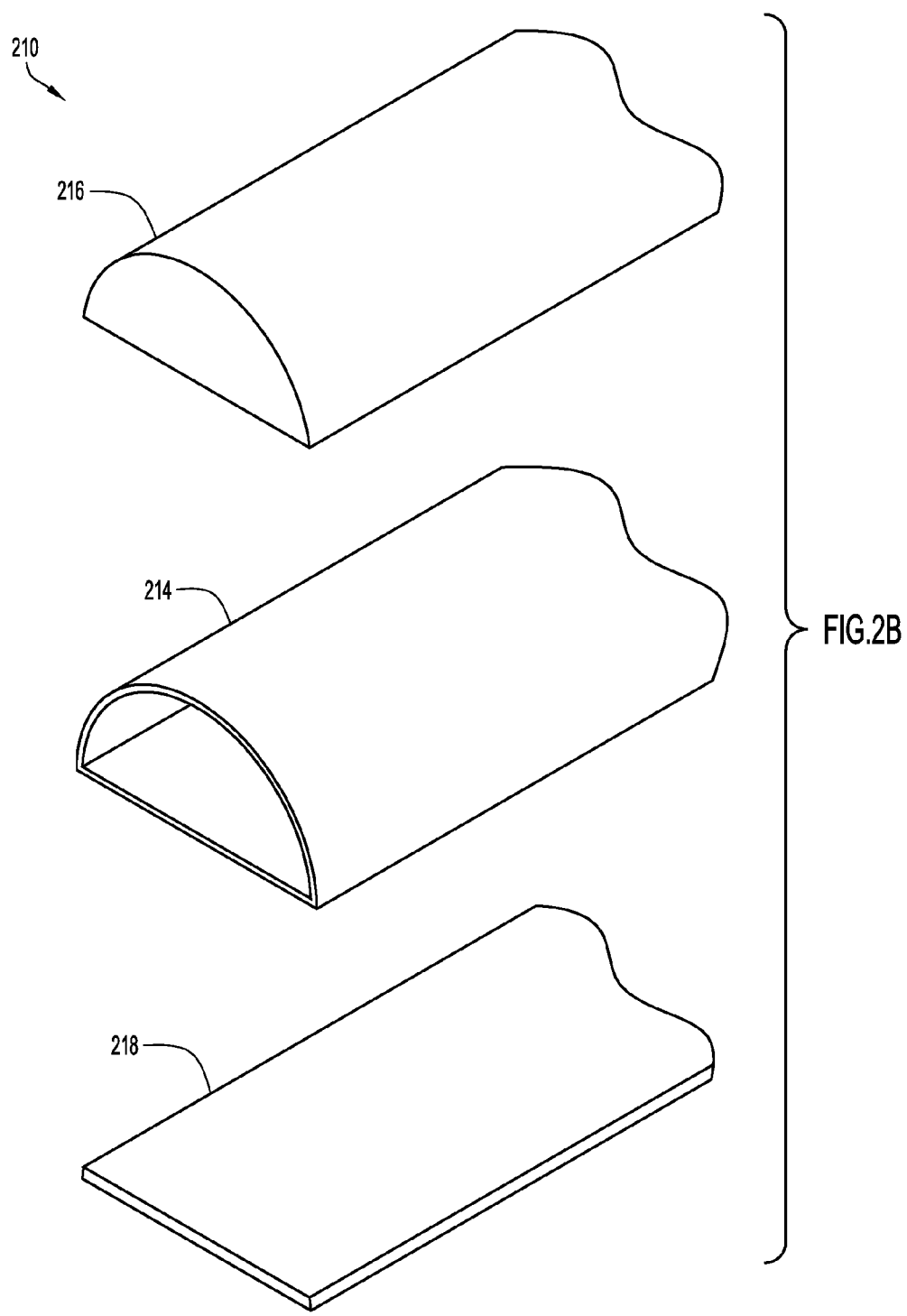

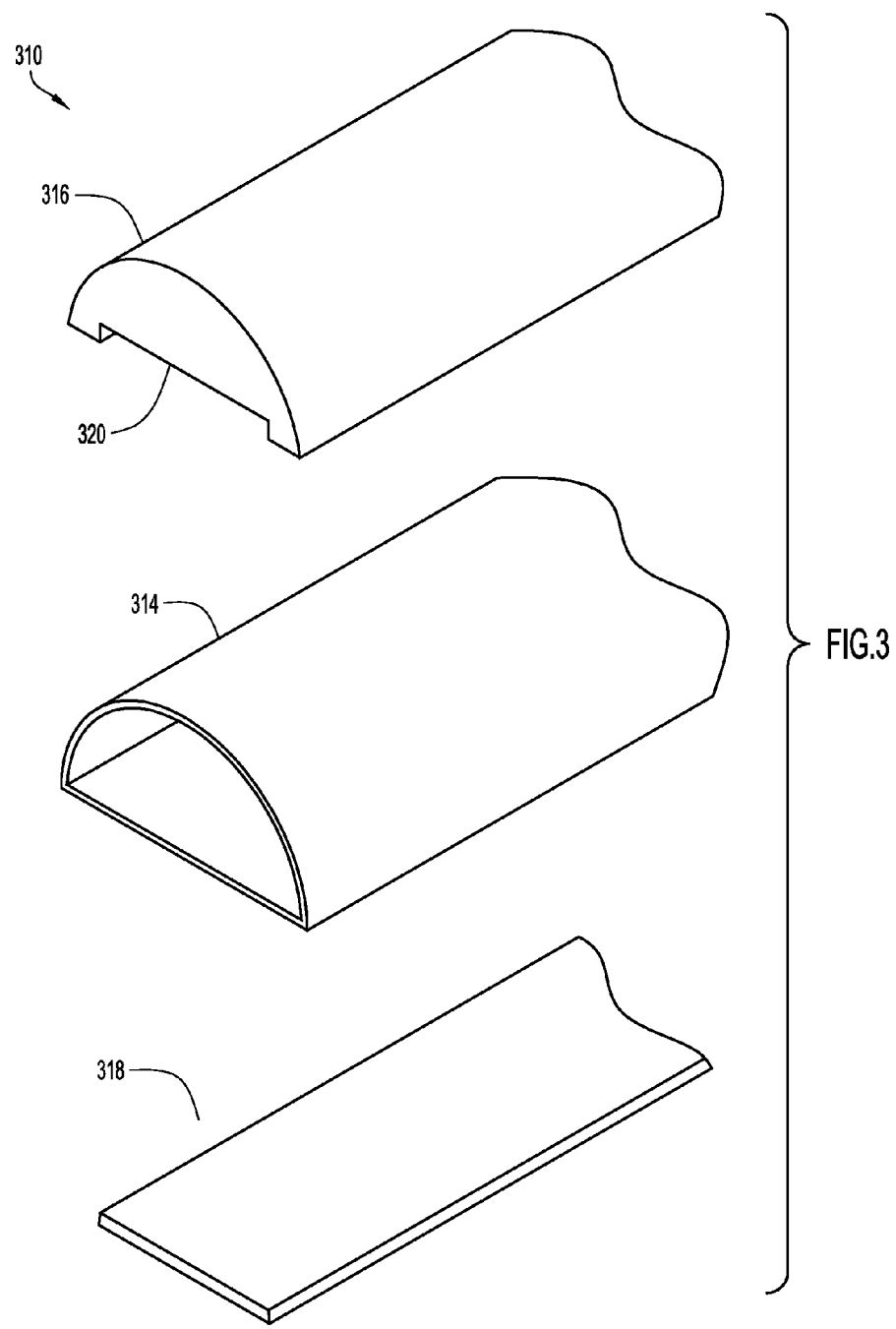

MAGNETIC ELECTROMAGNETIC INTERFERENCE GASKET

TECHNICAL FIELD

The present disclosure relates to a magnetic electromagnetic interference (EMI) gasket.

BACKGROUND

Electromagnetic interference (EMI) refers to the disruption of the operation of an electronic device when it is in the vicinity of an electromagnetic field (EM field) generated by another electronic device. To reduce the effects of EMI on neighboring electronic devices, an electronic device may include, or be surrounded by, a Faraday cage in order to minimize the passage of electromagnetic fields into or out of the device. Due to, for example, manufacturing and other limitations, these Faraday cages often include openings (e.g., gaps or holes) that allow passage of electromagnetic fields.

BRIEF DESCRIPTION OF THE DRAWINGS

FIG. 1A is a diagram illustrating a magnetic electromagnetic interference (EMI) gasket to seal an opening in an electronic device housing, in accordance with example embodiments.

FIG. 1B is a diagram illustrating an enlarged view of a portion of the electronic device housing and the EMI gasket of FIG. 1A.

FIG. 2B is an exploded view of the magnetic EMI gasket of FIG. 2A.

FIG. 3 is an exploded view of a magnetic EMI gasket, according to another example embodiment.

DESCRIPTION OF EXAMPLE EMBODIMENTS

Overview

Figure 2A:
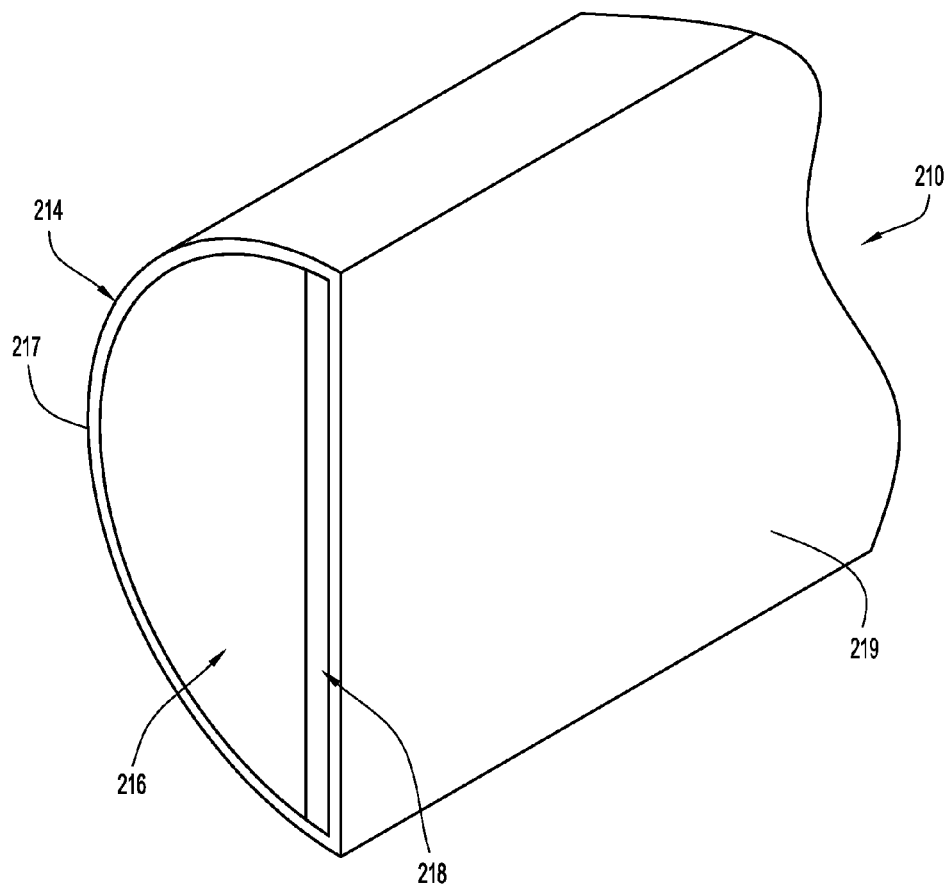
FIG. 2A is a cross-sectional perspective view of a magnetic EMI gasket, according to an example embodiment.

Presented herein are magnetic electromagnetic interference (EMI) gaskets that may be used to partially or fully close openings in a Faraday cage surrounding electronics, thereby reducing the amount of electromagnetic radiation that escapes through the openings. The EMI gaskets include a resiliently-flexible and conductive outer shell and a cushioning element disposed within the outer shell. The EMI gaskets also include at least one magnetic component disposed within the outer shell to magnetically couple the EMI gasket to a conductive surface of an electronic device chassis.
Example Embodiments Referring first to FIG. 1A, shown is an electronic device 100. In this example, the electronic device 100 includes a chassis/housing 102 that is configured (e.g., sized, shaped, etc.) to have electronics, such as electronic cards or other circuitry (not shown), positioned therein. The electronics located in the chassis 102 generate changing electrical currents and voltages that can generate electromagnetic fields, which propagate from the internal electronics outwards towards the chassis 102. Electromagnetic fields that escape the chassis 102 can cause electromagnetic interference (EMI) of neighboring electronics. In FIG. 1A, arrow 104 schematically illustrates one or more electromagnetic fields that propagate toward an area 106 of the chassis 102.

FIG. 1B is an enlarged view of the area 106 shown in FIG. 1A. In general, the chassis 102 is formed from a conductive material and operates as a Faraday cage to block the passage of the electromagnetic fields 104. However, as shown in FIGS. 1A and 1B, in area 106 the chassis 102 has an opening/gap 108 through which the electromagnetic fields 104 could escape.

To reduce or substantially prevent the escape of the electromagnetic fields 104 (and/or to prevent/reduce the entry of electromagnetic fields from other electronic devices), in FIGS. 1A and 1B the opening 108 is substantially closed by the magnetic EMI gasket 110. That is, the magnetic EMI gasket 110 is disposed in the opening 108 so as to substantially prevent the electromagnetic fields 104 from escaping the chassis 102. As described further below, the magnetic EMI gasket 110 is conductive and contacts two surfaces, referred to as surface 112a and 112b, defining at least a portion of the opening 108, thereby closing the gap in the Faraday cage created by the chassis 102 and, as a result, preventing the electromagnetic fields 104 from escaping the chassis 102.

As noted above, the chassis 102 forms a Faraday cage that is configured to prevent the passage of electromagnetic fields, regardless of their direction. As such, closing the opening 108 with the magnetic EMI gasket 110 may not only help protect other electronic devices from EMI resulting from the electromagnetic fields 104, but may also help protect the electronics in chassis 102 from EMI caused by neighboring electronic devices. Merely for ease of illustration, the magnetic EMI gaskets in accordance with examples presented herein are primarily described with reference to reducing and/or substantially preventing the exit of electromagnetic fields from an electronic device chassis. However, as noted, it is to be appreciated that the magnetic EMI gaskets presented herein may also be effective in reducing and/or substantially preventing the entry of electromagnetic fields into an electronic device chassis.

Referring next to FIG. 2A, shown is a cross-sectional perspective view of one arrangement for a magnetic EMI gasket 210 in accordance with the examples presented herein. FIG. 2B is an exploded view of the magnetic EMI gasket 210.

The magnetic EMI gasket 210 includes a conductive outer shell 214, a cushioning/buffering element 216, and a magnetic component 218. In this example, the conductive outer shell 214 substantially encloses the cushioning element 216 and the magnetic component 218. However, in other arrangements the conductive outer shell 214 may not fully enclose the cushioning element 216 and the magnetic component 218.

The conductive outer shell 214 is formed from a resiliently-flexible material (e.g., a conductive fabric) and the cushioning element 216 may be any suitable cushioning material, which may or may not be conductive. In one example, the cushioning element 216 comprises one or more pieces of foam. Before the conductive outer shell 214 is magnetically coupled to a conductive surface, the outer shell has a convex surface 217 extending from a planar surface 219 forming, in this example, a general D-shape. The magnetic EMI gasket 210 may take other shapes when coupled to an electronic device as the gasket may be compressed or otherwise manipulated to close certain openings in an electronic device chassis.

It is to be appreciated that the D-shape of the magnetic EMI gasket 210 shown in FIGS. 2A and 2B is illustrative and that other shapes are also possible. For example, the conductive outer shell 214 could alternatively have a P-shape, C-shape, V-shape, L-shape, or any other shape that may be used to substantially seal an opening in an electronic chassis, such as chassis 102 (FIGS. 1A and 1B).

The cushioning element 216 may be formed from a material (e.g., foam) that permits the magnetic EMI gasket 210 to adapt to a variety of openings with different shapes, sizes, and dimensions. For example, if the distance between opposing edges of an opening is smaller than the outer dimension of the magnetic EMI gasket 210, then edges may cause deformation of the D-shape of the magnetic EMI gasket 210. Because the outer shell 214 is conductive, electrical contact between the edges of an opening and the magnetic EMI gasket 210 causes the conductive environment to form a complete Faraday cage which, as noted above, reduces the passage of electromagnetic fields.

In the example of FIGS. 2A and 2B, the magnetic component 218 is an elongated magnet having a rectangular shape that extends the substantial length and width of the planar surface 219 of the outer shell 214. The width of the magnetic component 218 may be, in one specific example, in the range of approximately 0.5 mm-1.5 mm. The magnetic component 218 may formed by any suitable material having magnetic properties and may or may not be conductive.

Although FIGS. 2A and 2B illustrate the use of an elongated magnetic component 218, it is to be appreciated that magnetic components may have other shapes (e.g., square, circular, ovoid, etc.) and/or other dimensions. In addition, the magnetic component 218 may comprise a plurality of magnetic components. For example, in one arrangement a plurality of magnetic components are positioned closely together (e.g., stacked components) or different magnetic component may be spaced throughout the conductive shell. In one such arrangement, the plurality of magnetic components may have different shapes.

Magnetic EMI gasket 210 may be used in a manner similar to magnetic EMI gasket 110 in FIG. 1B. In particular, the magnetic EMI gasket 210 may be positioned in an opening in a conductive environment (e.g., a conductive housing such as chassis 102), with the conductive outer shell 214 in electrical contact with edges (e.g., edges 112a and 112b) of an opening. The magnetic component 218 magnetically couples the EMI gasket 210 to a conductive surface in order to ensure effective electrical contact between the conductive outer shell 214 and the edges of the opening. For example, the magnetic component 218 may magnetically couple to edges 112a and 112b in FIG. 1B. This ensures a reliable electrical connection between the conductive outer shell 214 and edge 112b, as well as between the conductive outer shell 214 and edge 112a (i.e., the edges 112a and 112b are electrically connected to one another via the conductive outer shell 214).

There are a variety of methods for manufacturing a magnetic EMI gasket (e.g., magnetic EMI gasket 210). In one example, the magnetic EMI gasket may be manufactured by inserting the cushioning element 216 and the magnetic component 218 into the conductive outer shell 214. The cushioning element 216 may be inserted before the magnetic component 218, or the magnetic component 218 may be inserted before the cushioning element 216. Alternatively, the cushioning element 216 and magnetic component 218 may be inserted into the conductive outer shell 214 simultaneously. For example, magnetic component 218 may be adhered (e.g., via an adhesive, epoxy, etc.) to the cushioning element 216 before the cushioning element 216 and magnetic component 218 are simultaneously inserted into the conductive outer shell 214. In an alternative example, the conductive outer shell 214 may be formed (e.g., molded) around the cushioning element 216 and/or the magnetic component 218.

FIG. 3 is an exploded view of another arrangement for a magnetic EMI gasket 310 in accordance with examples presented herein. In this arrangement, the magnetic EMI gasket 310 comprises a conductive outer shell 314 and a magnetic component 318 which are similar to conductive outer shell 214 and magnetic component 218, respectively, described above in connection with FIGS. 2A and 2B. Cushioning element 316 may be similar to cushioning element 216 of FIGS. 2A and 2B except that cushioning element 316 has a cutout 320 for the magnetic component 318. The cutout 320 may be a recess formed in the cushioning element 316 in which the magnetic component 318 may be positioned. In one example, the magnetic component 318 may be positioned and secured (e.g., adhered) in the cutout 320 before being inserted into the conductive outer shell 314. Alternatively, the magnetic component 318 may be positioned in the cutout 320 before the conductive outer shell 314 is formed around the cushioning element 316 and magnetic component 318.

Similar to the above examples, the magnetic component 318 may have any of a number of suitable shapes. Additionally, the magnetic EMI gasket 310 may comprise a plurality of magnetic components disposed throughout the gasket.

Figure 4:
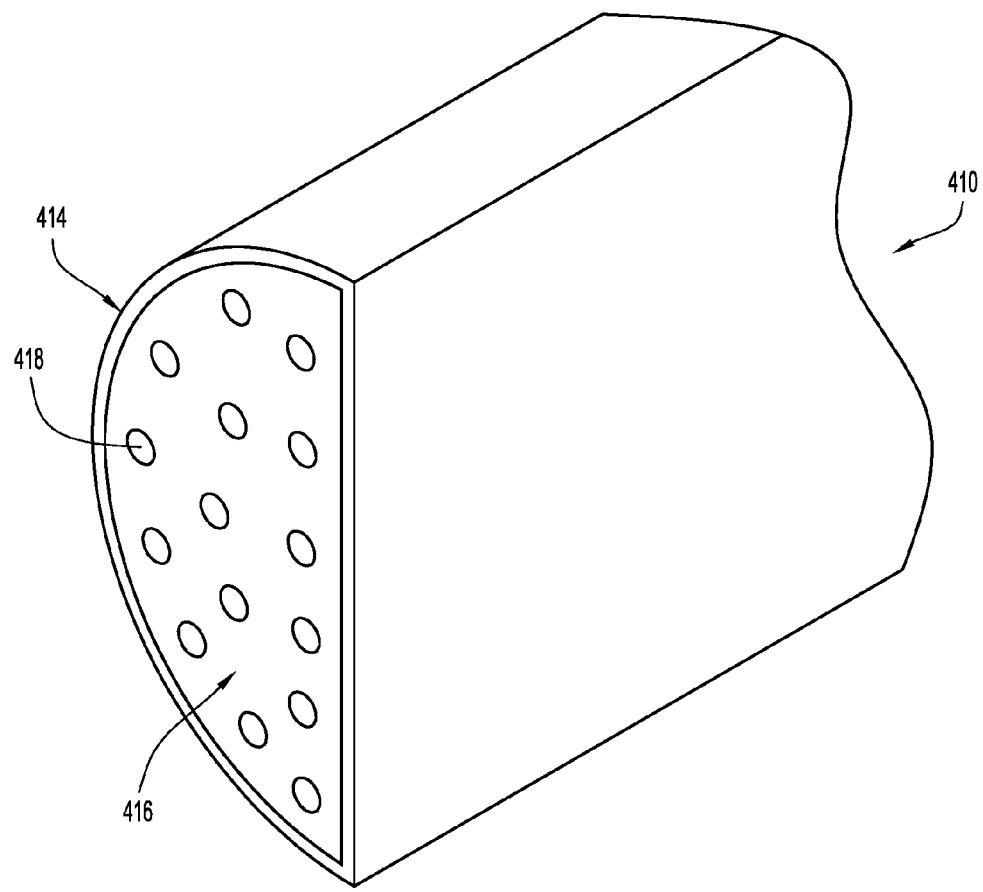
FIG. 4 is a cross-sectional perspective view of another magnetic EMI gasket, according to an example embodiment.

FIG. 4 is a cross-sectional perspective view of another arrangement for a magnetic EMI gasket 410 in accordance with examples presented herein. In this arrangement, the magnetic EMI gasket 410 comprises a conductive outer shell 414 which is similar to conductive outer shell 214 described above in connection with FIGS. 2A and 2B. Cushioning element 416 may be similar to cushioning element 216 of FIGS. 2A and 2B except that cushioning element 416 has a plurality of magnetic components 418 interspersed within the cushioning element 416.

Magnetic EMI gasket 410 may be implemented in a manner similar to magnetic EMI gasket 110 in FIG. 1B. In particular, the magnetic EMI gasket 410 may be provided in an opening in a conductive environment (e.g., a conductive housing such as chassis 102), with the conductive outer shell 414 in electrical contact with edges (e.g., edges 112a and 112b) of the opening. The magnetic components 418 magnetically couple the EMI gasket 210 to a conductive surface in order to ensure effective electrical contact between the conductive outer shell 414 and the opposing edges of the opening.

FIG. 4 illustrates a plurality of magnetic components 418 interspersed within the cushioning element 416. In an alternative embodiment, magnetic EMI gasket 410 may include one larger magnetic component embedded within the cushioning element 416. In further examples, magnetic EMI gasket 410 may include one or more magnetic components positioned between the cushioning element 416 and the planar portion of the conductive outer shell 414.

Figure 5:
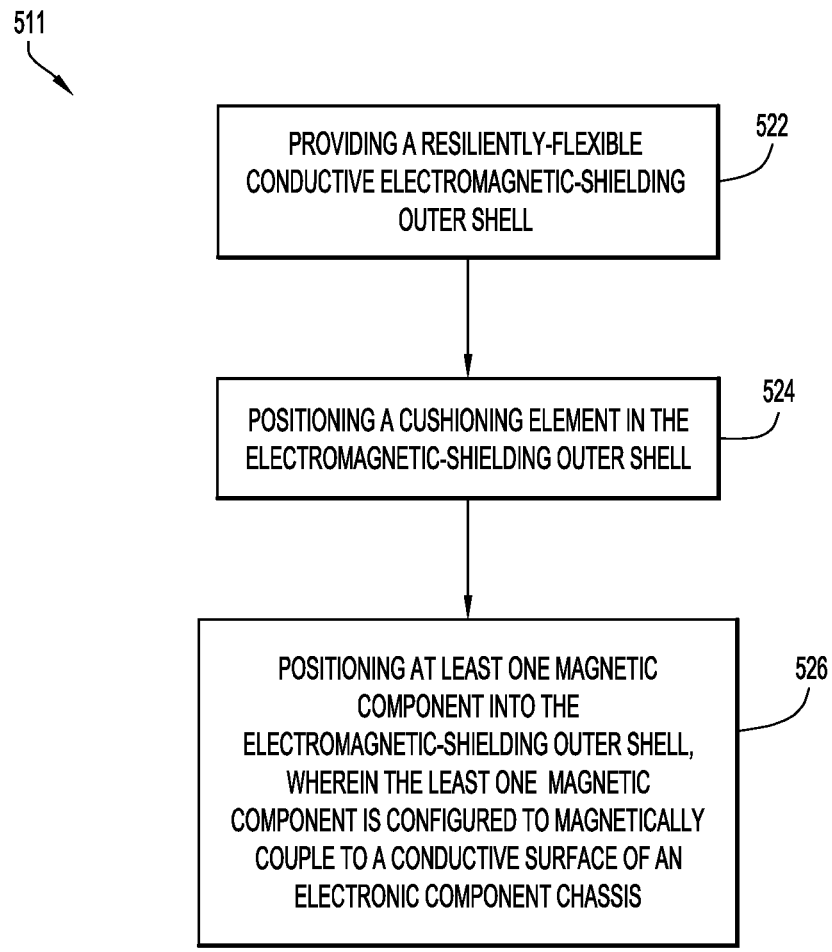
FIG. 5 is a flowchart of a method in accordance with an example embodiment.

FIG. 5 is a flowchart of a method 511 in accordance with examples presented herein. Method 511 begins at 522, where a resiliently-flexible and conductive outer shell is provided. At 524, a cushioning element is positioned in the outer shell. At 526, at least one magnetic component is positioned into the outer shell. The at least one magnetic component is configured to magnetically couple to a conductive surface of an electronic device chassis.

In one form, an electromagnetic interference gasket is provided. The electromagnetic interference gasket comprises: a resiliently-flexible and conductive outer shell; a cushioning element disposed in the outer shell; and at least one magnetic component disposed in the outer shell configured to magnetically couple to a conductive surface of an electronic device chassis.

In another form, a method for manufacturing an electromagnetic interference gasket is provided. The method comprises: providing a resiliently-flexible and conductive outer shell; positioning a cushioning element in the outer shell; and positioning at least one magnetic component into the outer shell, wherein the least one magnetic component is configured to magnetically couple to a conductive surface of an electronic device chassis.

In another form, an electromagnetic interference gasket is provided. The electromagnetic interference gasket comprises: a resiliently-flexible and conductive fabric; a cushioning foam substantially enclosed by the conductive fabric; and at least one elongated magnet component disposed in the conductive fabric.

Although the techniques are illustrated and described herein as embodied in one or more specific examples, it is nevertheless not intended to be limited to the details shown, since various modifications and structural changes may be made within the scope and range of equivalents of the claims.

What is claimed is:

1. An electromagnetic interference gasket comprising:
a resiliently-flexible and conductive outer shell;
at least one cushioning element disposed in the outer shell; and
a plurality of magnetic components disposed in the outer shell configured to magnetically couple to a conductive surface of an electronic device chassis, wherein the plurality of magnetic components are distributed throughout the at least one cushioning element.

2. The electromagnetic interference gasket of claim 1, further comprising at least one magnetic component that comprises a resiliently-flexible magnetic element disposed between the at least one cushioning element and the outer shell.

3. The electromagnetic interference gasket of claim 2, wherein the at least one cushioning element includes a cutout for the at least one magnetic component.

4. The electromagnetic interference gasket of claim 1, wherein at least one magnetic component of the plurality of magnetic components comprises an elongated magnet.

5. The electromagnetic interference gasket of claim 1, wherein the outer shell comprises a conductive fabric.

6. The electromagnetic interference gasket of claim 1, wherein the at least one cushioning element comprises a foam.

7. A method for manufacturing an electromagnetic interference gasket, comprising:
providing a resiliently-flexible and conductive outer shell;
positioning at least one cushioning element in the outer shell; and
positioning a plurality of magnetic components in the outer shell, wherein the least one magnetic component is configured to magnetically couple to a conductive surface of an electronic device chassis, wherein the plurality of magnetic components are distributed throughout the at least one cushioning element.

8. The method of claim 7, further comprising:
adhering at least one magnetic component to the at least one cushioning element.

9. The method of claim 8, further comprising:
simultaneously inserting the at least one magnetic component of the plurality of magnetic components and the at least one cushioning element into the outer shell.

10. The method of claim 7, further comprising:
preparing a cutout in the at least one cushioning element.

11. The method of claim 10, further comprising:
positioning at least one magnetic component of the plurality of magnetic components in the cutout.

12. The method of claim 7, wherein at least one magnetic component of the plurality of magnetic components comprises an elongated magnet.

13. The method of claim 12, wherein:
positioning the at least one magnetic component in the outer shell comprises inserting the elongated magnet into the outer shell.

14. The method of claim 7, wherein the outer shell is a conductive fabric.

15. The method of claim 7, wherein the at least one cushioning element comprises a foam.

16. An electromagnetic interference gasket comprising:
a resiliently-flexible and conductive fabric;
a cushioning element substantially enclosed by the conductive fabric; and
a plurality of elongated magnet components disposed in the conductive fabric, wherein the plurality of elongated magnet components are distributed throughout the cushioning element.

17. The electromagnetic interference gasket of claim 16, further comprising at least one elongated magnet component disposed between the cushioning element and the conductive fabric.

18. The electromagnetic interference gasket of claim 16, wherein the cushioning element includes a cutout for at least one elongated magnet component of the plurality of magnet components.

19. The electromagnetic interference gasket of claim 16, wherein at least one elongated magnet component of the plurality of elongated magnet components is resiliently-flexible.

20. The electromagnetic interference gasket of claim 16, wherein the cushioning element comprises a foam.

* * * * *